United States Patent
Akimoto

(10) Patent No.: US 9,906,242 B2
(45) Date of Patent: Feb. 27, 2018

(54) CONTROL DEVICE PERFORMING LIFETIME PREDICTION BY ERROR CORRECTION FUNCTION

(71) Applicant: FANUC Corporation, Minamitsuru-gun, Yamanashi (JP)

(72) Inventor: Shinji Akimoto, Minamitsuru-gun (JP)

(73) Assignee: FANUC Corporation, Minamitsuru-gun, Yamanashi (JP)

(*) Notice: Subject to any disclaimer, the term of this patent is extended or adjusted under 35 U.S.C. 154(b) by 11 days.

(21) Appl. No.: 15/045,349

(22) Filed: Feb. 17, 2016

(65) Prior Publication Data
US 2016/0254827 A1 Sep. 1, 2016

(30) Foreign Application Priority Data
Feb. 26, 2015 (JP) .................. 2015-037377

(51) Int. Cl.
*H03M 13/00* (2006.01)
*H03M 13/35* (2006.01)
(Continued)

(52) U.S. Cl.
CPC ....... *H03M 13/353* (2013.01); *G06F 11/3409* (2013.01); *H03M 13/152* (2013.01); *H03M 13/1515* (2013.01)

(58) Field of Classification Search
None
See application file for complete search history.

(56) References Cited

U.S. PATENT DOCUMENTS 5,233,610 A * 8/1993 Nakayama ............ G11C 29/20
                                              365/200
7,757,152 B2 * 7/2010 Wickeraad ........... G06F 11/106
                                              714/763
(Continued)

FOREIGN PATENT DOCUMENTS

JP    2012-155737 A    8/2012
JP    2012-178014 A    9/2012
(Continued)

OTHER PUBLICATIONS

Notification of Reasons for Refusal drafted Feb. 3, 2017 in Japanese Patent Application No. 2015-037377 (3 pages) with English Translation (3 pages).

*Primary Examiner* — Daniel McMahon
(74) *Attorney, Agent, or Firm* — Drinker Biddle & Reath LLP

(57) ABSTRACT

A control device that performs encoding of data to a code word and decoding from the code word to data by an error correction code is disclosed. The control device has an error correction function by which a correctable error is automatically corrected in the decoding. The control device includes an error correction processing unit which switches error correction codes based on a correction rate, which is outputted from a correction rate calculation unit, of every state so as to perform encoding from data to a code word and decoding from the code word to data and output correction information related to error correction. A lifetime calculation unit calculates a device lifetime which is a current remaining lifetime of a device based on a correction capability value of a current error correction code, a current correction rate, and a failure factor coefficient of a current operation state.

16 Claims, 8 Drawing Sheets

(51) Int. Cl.
  *G06F 11/34* (2006.01)
  *H03M 13/15* (2006.01)

(56) References Cited

U.S. PATENT DOCUMENTS

| | | | |
|---|---|---|---|
| 8,321,727 B2 * | 11/2012 | D'Abreu | G06F 11/1068 |
| | | | 714/718 |
| 2008/0222490 A1 | 9/2008 | Leung et al. | |
| 2011/0154158 A1 | 6/2011 | Yurzola et al. | |
| 2012/0066439 A1 * | 3/2012 | Fillingim | G06F 11/3485 |
| | | | 711/103 |
| 2013/0148435 A1 | 6/2013 | Matsunaga | |
| 2013/0212427 A1 * | 8/2013 | Franceschini | G11C 29/56008 |
| | | | 714/6.13 |
| 2014/0281133 A1 * | 9/2014 | Karamcheti | G06F 3/061 |
| | | | 711/103 |
| 2016/0188405 A1 | 6/2016 | Li et al. | |

FOREIGN PATENT DOCUMENTS

| | | |
|---|---|---|
| JP | 2013-516000 A | 5/2013 |
| JP | 2013-122793 A | 6/2013 |
| JP | 2013-542533 A | 11/2013 |

\* cited by examiner

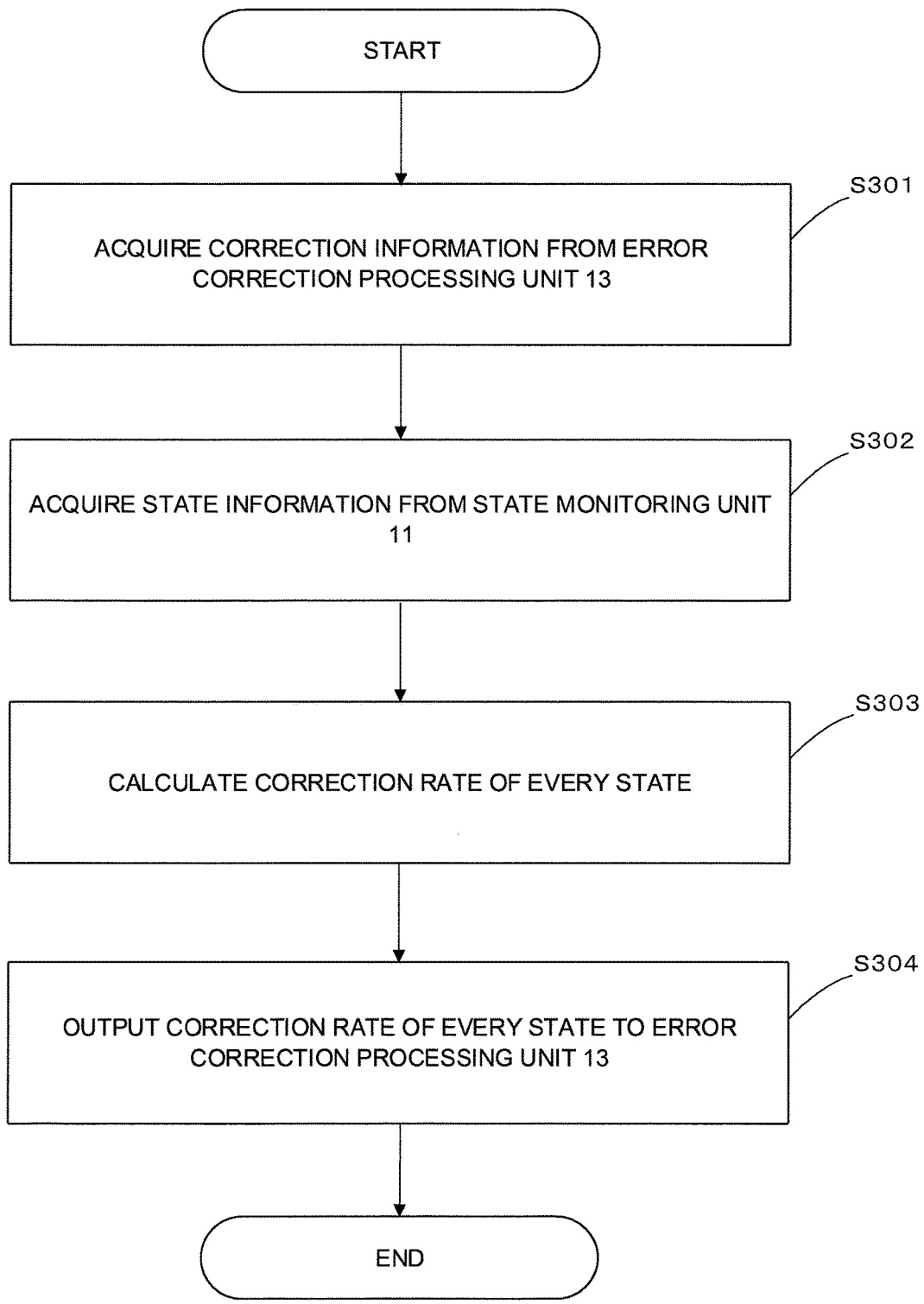

FIG.4

| NUMBER OF ENCODING TIMES (X-TH TIME) | STATE INFORMATION | CORRECTED BIT NUMBER E |
|---|---|---|
| 1 | LOW TEMPERATURE | 0 |
| 2 | LOW TEMPERATURE | 0 |
| 3 | NORMAL TEMPERATURE | 0 |
| 4 | HIGH TEMPERATURE | 0 |
| 5 | HIGH TEMPERATURE | 1 |
| 6 | HIGH TEMPERATURE | 0 |
| 7 | HIGH TEMPERATURE | 0 |
| 8 | HIGH TEMPERATURE | 2 |
| 9 | HIGH TEMPERATURE | 0 |
|  |  |  |

↓ EXTRACT ONLY CORRECTION INFORMATION CORRESPONDING TO STATE INFORMATION REPRESENTING HIGH TEMPERATURE

CORRECTION HISTORY LIMITED TO HIGH TEMPERATURE STATE

| NUMBER OF ENCODING TIMES IN HIGH TEMPERATURE STATE (X-TH TIME) | 1 | 2 | 3 | 4 | 5 | 6 |
|---|---|---|---|---|---|---|
| CORRECTED BIT NUMBER $E_s$ IN HIGH TEMPERATURE STATE | 1 | 0 | 2 | 0 | 1 | 0 |

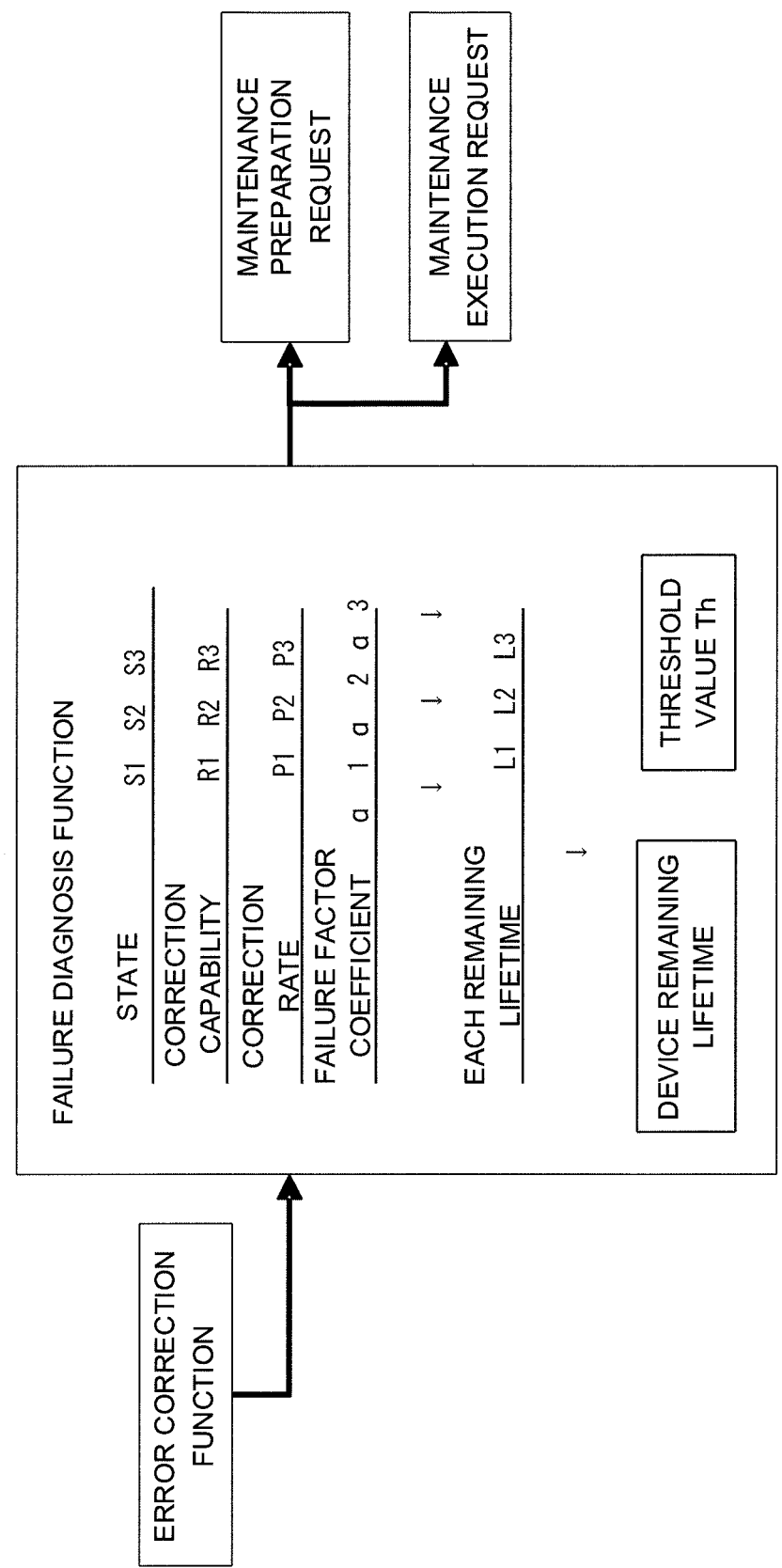

CONTROL DEVICE PERFORMING LIFETIME PREDICTION BY ERROR CORRECTION FUNCTION

RELATED APPLICATION DATA

This application claims priority under 35 U.S.C. § 119 and/or § 365 to Japanese Application No. 2015-037377 filed Feb. 26, 2015, the entire contents is incorporated herein by reference.

BACKGROUND OF THE INVENTION

1. Field of the Invention

The present invention relates to a control device having an error correction function which is used in a memory and communication. By the error correction function, an error is automatically corrected so as to enhance reliability of a device and a system. Further, the present invention especially relates to a control device which has an error correction function and is used in industrial device and system which have to be normally operated under an inferior operation environment due to temperature, vibration, noise, or the like and a device and a system whose reliability is required such as medical, aerospace, and public systems.

2. Description of the Related Art

Failure prediction performed by using a device lifetime which represents a period in which a device can be normally used enables advance preparation of replacement of components so as to be able to shorten failure recovery time. Shortening of failure recovery time improves capacity of a production line, so that it is required to predict device lifetimes of devices on a production line with high accuracy.

In general, failures of specific parts are increased along with secular change in a memory in which writing and deletion of information are repeated. A system constituted of a memory having an error correction function operates without any problems in a case of an occurrence of a failure within a range of correction capability of the error correction function. On the other hand, in a case where a failure beyond the correction capability occurs, correction is impossible and the system has to be stopped.

Therefore, an operation rate of the error correction capability is set to a device lifetime so as to be able to prepare a countermeasure against a failure before the system stops due to a failure of a memory.

As a prior art technique, a failure prediction method in which deterioration progress of a device is calculated based on a correction record of an error correction function so as to take measures against a failure in an early stage is proposed (refer to Japanese Patent Application Laid-Open No. 2012-155737).

Here, the error correction function is an error correction method by which an error is automatically corrected by using an error correction code so as to improve reliability of data. The error correction code has been conventionally studied as a code logic and various structures of correction codes having different functions such as a correction code specialized for a burst error and a correction code whose capability of error correction is locally enhanced have been proposed.

As a prior art technique, an error correction function in which a plurality of error correction codes are provided and the error correction codes are switched is proposed (refer to Japanese Patent Application Laid-Open No. 2012-178014).

In general, in design of an error correction function, an error correction code having enough tolerance is designed while assuming an error generated by an error cause depending on variation in manufacturing of a device, an installation environment, and an operation state. Therefore, an error correction function using a single error correction code is a waste of resources in a certain individual.

There are a plurality of forms in a failure of a device. Further, a cause accelerating a failure of a device varies depending on the form. For example, in a memory device, there is a case where probability of an occurrence of a failure in which a specific memory region is fixed on a specific state due to unevenness of the quality or the like is increased when the memory device is used in a high temperature environment. In general, a cause of a failure is grown resulting from an operating state of a device. Therefore, if a causal relationship between a failure of a device and an operating state of the device is known and can be reflected, a device lifetime can be predicted with high accuracy.

It is possible to provide a control device which has a function to calculate a device lifetime highly accurately by reflecting a result of failure analysis of every operating state to calculation of the device lifetime and outputs a maintenance preparation request and a maintenance execution request in accordance with a current device lifetime in an error correction function in which error correction codes are switched in accordance with an operation state.

In order to do that, a device lifetime may be able to be first calculated by using an error correction function in which error correction codes are switched. However, a device lifetime which is calculated based on the number of correctable bits in a prior art technique is discontinuous due to switching of an error correction code in an error correction function for switching to an error correction code having the different number of correctable bits. Thus, it has been impossible to correspond to switching of error correction codes.

SUMMARY OF THE INVENTION

Therefore, an object of the present invention is to provide a control device which predicts a lifetime with high accuracy while taking into account a failure factor of every operation state by using a dynamic error correction function corresponding to an operating state.

According to the present invention, correction capability of an error correction code using the number of correctable bits is introduced in calculation of a device lifetime so as to be able to compare device lifetimes which are calculated based on error correction codes having different correction capabilities from each other. Further, according to the present invention, such control device is provided that introduces a variable of every operating state in calculation of a device lifetime so as to reflect a result of failure analysis of every operating state; predict a device lifetime with high accuracy, and output a maintenance preparation request and a maintenance execution request in accordance with a current device lifetime.

A control device, according to the present invention, which performs encoding from information data to a code word and decoding from a code word to information data by an error correction code and has an error correction function by which a correctable error is automatically corrected in the decoding, includes a state monitoring unit which monitors a state of a monitoring object and outputs state information, a correction rate calculation unit which calculates a correction rate of every state based on the state information, which is outputted by the state monitoring unit, and error correction information and outputs the correction rate, an error correction processing unit which includes an error correction code group, which includes a plurality of error correction codes which have an order of correction capability which is defined based on a predetermined reference, and switches the error correction codes based on the correction rate of every state, which is outputted from the correction rate calculation unit, so as to perform encoding from information data to a code word and decoding from a code word to information data and output correction information related to error correction, and a lifetime calculation unit which calculates a device lifetime which is a current remaining lifetime of a device based on a correction capability value of a current error correction code, a current correction rate, and a failure factor coefficient of a current operation state.

The control device according to the present invention may further include a failure factor coefficient rewriting means which rewrites the failure factor coefficient.

The control device according to the present invention may further include a maintenance preparation information output means which monitors a device lifetime which is outputted by the lifetime calculation unit and outputs maintenance preparation information.

The control device according to the present invention may further include a threshold value rewriting means which rewrites a threshold value by which output of maintenance preparation information of the maintenance preparation information output means is determined.

The control device according to the present invention may further include a maintenance execution information output means which monitors a device lifetime which is outputted by the lifetime calculation unit and outputs maintenance execution information.

The control device according to the present invention may further include a means for rewriting a threshold value, by which output of the maintenance execution information output means is determined, from an outside.

The control device according to the present invention may further include a means by which the failure factor coefficient is statistically calculated based on states of a plurality of machines.

The present invention is provided with the above-described configurations, so that it is possible to provide a control device which predicts a lifetime with high accuracy while taking into account a failure factor of every operating state by using a dynamic error correction function corresponding to an operation state.

BRIEF DESCRIPTION OF THE DRAWINGS

The above-described and other objects and features of the present invention will be apparent from the following description of an embodiment in reference to the accompanying drawings. Among these drawings:

FIG. 3 is a flowchart illustrating an operation of a correction rate calculation unit according to the present invention;

FIG. 4 illustrates a correction information history table according to the present invention;

FIG. 8 is a functional block diagram illustrating the control device having a failure diagnosis function using a device remaining lifetime according to the present invention.

DETAILED DESCRIPTION OF THE PREFERRED EMBODIMENT

An embodiment of the present invention will be described below with reference to the accompanying drawings.

Figure 1:
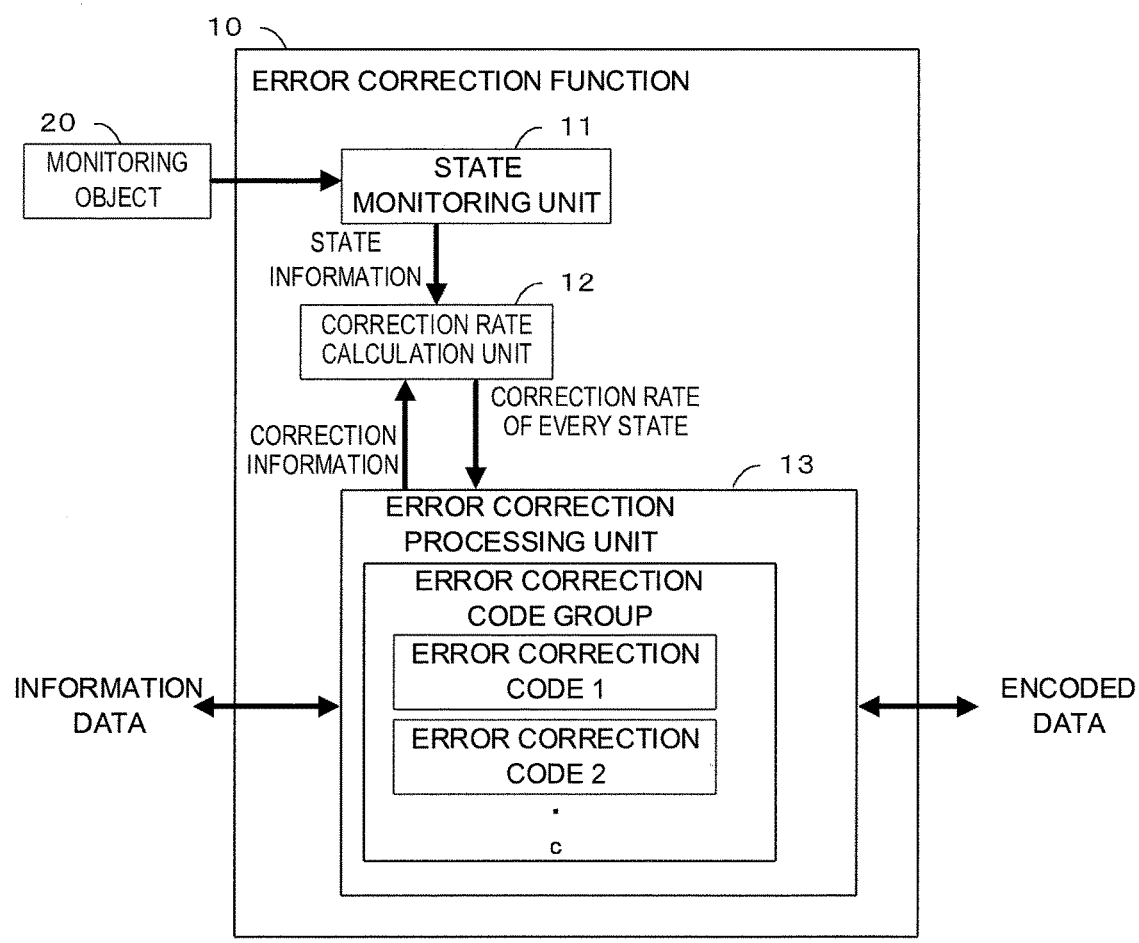
FIG. 1 is a functional block diagram illustrating a control device which has an error correction function implemented with an error correction method according to the embodiment of the present invention.

FIG. 1 is a functional block diagram illustrating a control device which has an error correction function according to the present embodiment. A control device 10 includes a state monitoring unit 11 which monitors a state of a monitoring object 20, a correction rate calculation unit 12 which calculates a correction rate of every state, and an error correction processing unit 13 which performs encode processing of information data and decode processing of encoded data.

Operations of respective functional means which constitute the control device 10 are described below in detail.

Figure 2:
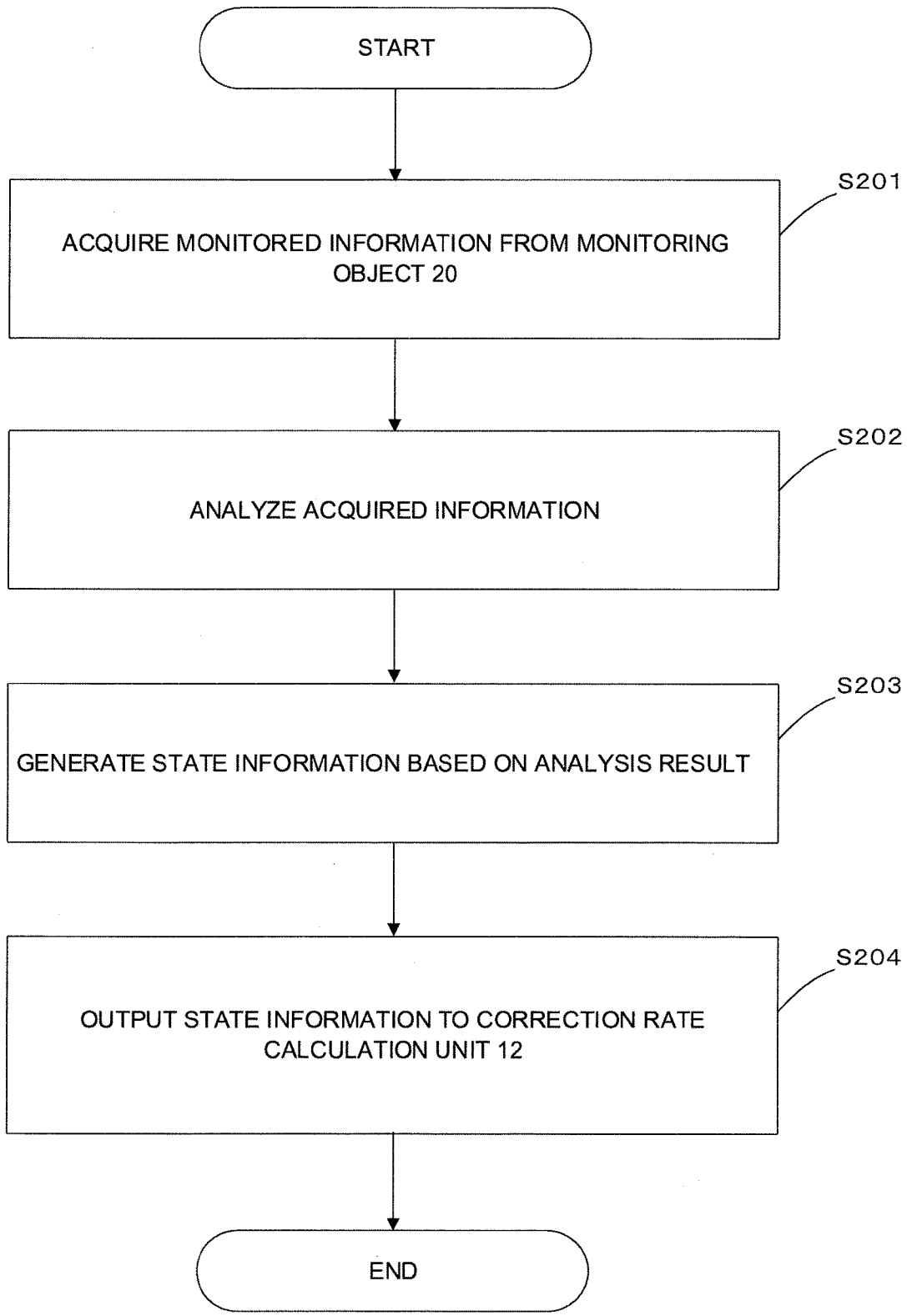
FIG. 2 is a flowchart illustrating an operation of a state monitoring unit according to the present invention.

FIG. 2 is a flowchart illustrating an operation of the state monitoring unit 11 according to the present embodiment. The state monitoring unit 11 acquires information about the monitoring object 20 (S201) and analyzes a state of the monitoring object 20 based on the acquired information (S202). Then, the state monitoring unit 11 generates state information based on the analyzed state of the monitoring object 20 (S203) and outputs the generated state information to the correction rate calculation unit 12 (S204).

The monitoring object 20 may be a machine tool in which the control device 10 is incorporated, for example. Information for analyzing the state of the monitoring object 20 in that case may be temperature information which is acquired from a temperature sensor which is provided to the machine tool, for example. In a case where temperature information is used, a temperature range, to which a temperature acquired from a temperature sensor provided to the monitoring object 20 belongs, among temperature ranges which are defined based on a set temperature threshold value, is analyzed and a state such as a high temperature, a normal temperature, and a low temperature is generated as state information so as to output the state information to the correction rate calculation unit 12.

Further, the monitoring object 20 may be a processor which executes a control program, for example. A state of the monitoring object 20 may be a value of a program counter provided to the processor. In this case, which program block is in execution is analyzed based on a value, which is acquired from the monitoring object, of the program counter and a name of the program block is generated as state information so as to output the state information to the correction rate calculation unit 12.

Here, as for information used for analyzing the state of the monitoring object 20 such as a threshold value of a temperature range and definition of the program block, preliminarily-defined information may be used or a means for setting information used for the analysis from the outside may be incorporated in the control device. Due to such configuration, change of an installation position of the monitoring object 20 and the like can be better handled by setting change.

The monitoring object 20 may be industrial device and system, or a device and a system, whose reliability is required, such as medical-, aerospace-, and public systems other than those described above. As information used for analyzing the state of the monitoring object 20, various kinds of information, which influence on a device and a system, such as vibration, noise, and radiation dose, may be used.

FIG. 3 is a flowchart illustrating an operation of the correction rate calculation unit 12 according to the present embodiment. When the correction rate calculation unit 12 acquires correction information from the error correction processing unit 13 (S301), the correction rate calculation unit 12 acquires state information from the state monitoring unit 11 (S302) and calculates a correction rate for every state based on the state information acquired from the state monitoring unit 11 and the correction information acquired from the error correction processing unit 13 (S303) so as to output the calculated correction rate of every state to the error correction processing unit 13 (S304).

In general, an error correction code has T bits which are the number of error correctable bits as correction capability. Encoding for converting information data having K bits into a code word having N bits and decoding for detecting and correcting an error of the code word to restore information data are performed. When an error of T bits or more is detected, a result of an uncorrectable state is outputted. Examples of correction capability of an error correction code include parameters such as the number of burst error correctable bits with respect to a burst error, the number of random error correctable bits with respect to a random error, and a coding rate represented by N/K.

The correction rate is defined as a parameter representing an occurrence state of the latest error by using the corrected bit number which is corrected by the error correction code. As one embodiment, in a case where an error correction code whose number of error correctable bits is T bits is used, a correction rate P at time when predetermined times J of correction is performed may be defined as Formula 1 by using the number of code words $C_i$ (i=1, ..., j) which are decoded until each correction and each corrected bit number $E_i$ (i=1, ..., j). A means for changing the predetermined times J may be incorporated in the control device. Due to such configuration, environment change of an installation position of the monitoring object 20 and the like can be better handled by setting change.

$$\text{Correction rate } P = (\Sigma(E_i/(C_i \times T)))/J \quad \text{(Formula 1)}$$

In order to enable such calculation of a correction rate of every state, the correction rate calculation unit 12 associates correction information acquired from the error correction processing unit 13 with state information acquired from the state monitoring unit 11 so as to store and manage the associated information in a correction information history table as a correction history. When a correction rate of every state is calculated, a correction history associated with a specific state is extracted from the correction information history table so as to calculate a correction rate of every state.

In a case where state information can be information of a high temperature, a normal temperature, and a low temperature, for example, when the correction rate calculation unit 12 acquires correction information from the error correction processing unit 13, the correction rate calculation unit 12 acquires state information (the high temperature, the normal temperature, or the low temperature), at time when the correction information is acquired, of the monitoring object 20 from the state monitoring unit 11 so as to store the correction information and the state information in the correction information history table. In this case, a correction history is stored in the correction information history table as illustrated in FIG. 4. In calculation of a correction rate in a case where state information represents a state of the high temperature based on the correction information history table illustrated in FIG. 4, a correction history in which the state of the high temperature is recorded in the column of state information may be extracted from the correction information history table so as to calculate a correction rate by applying the extracted correction history to the above-mentioned calculation formula.

Figure 5:
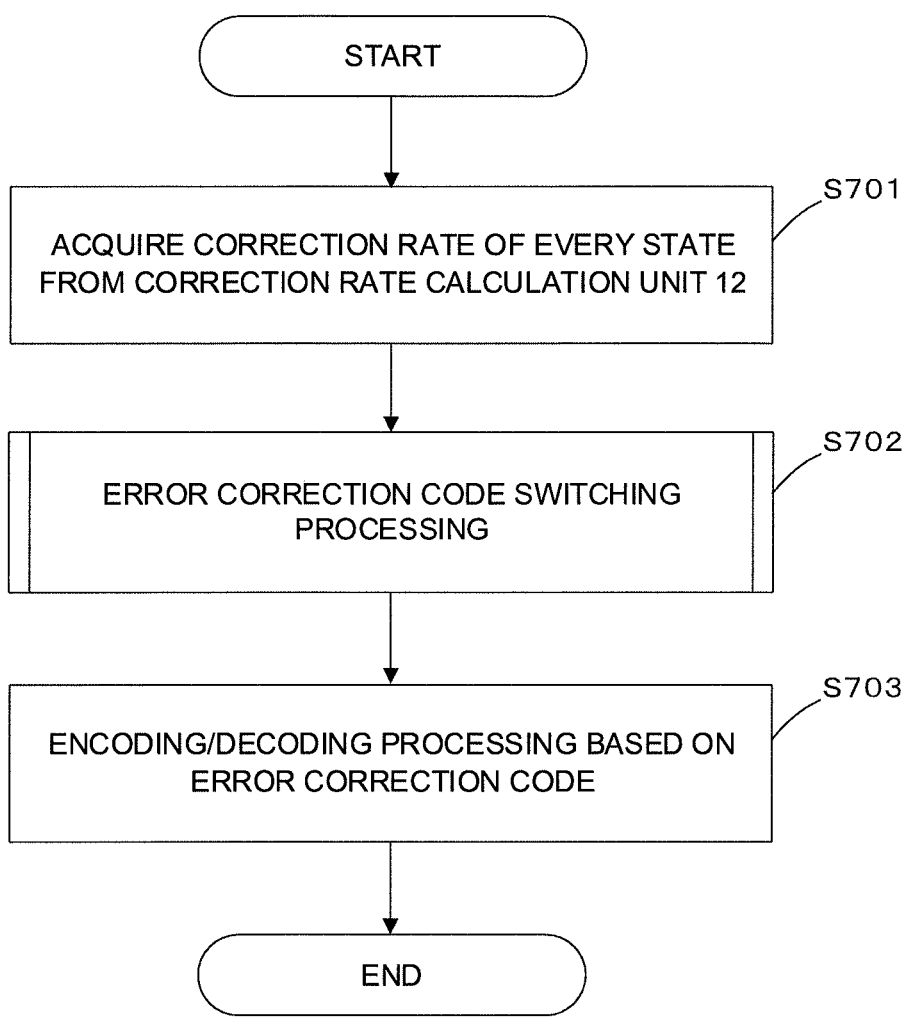
FIG. 5 is a flowchart illustrating an operation of an error correction processing unit according to the present invention.

FIG. 5 is a flowchart illustrating an operation of the error correction processing unit 13 according to the present embodiment. The error correction processing unit 13 acquires a correction rate of every state from the correction rate calculation unit 12 (S701) and selects a more proper error correction code from an error correction code group based on the acquired correction rate of every state and switches the error correction code (S702). Then, the error correction processing unit 13 performs encoding processing from information data to a code word and decoding processing from a code word to information data based on the switched error correction code (S703).

After executing the decoding processing of the code word, the error correction processing unit 13 outputs correction information based on a result of the decoding processing. Correction information includes information of the bit number which is corrected by the correction processing in a case where the correction processing with respect to the code word is performed, in the decoding processing with respect to the code word. The outputted correction information is used by the correction rate calculation unit 12 for calculation of a correction rate of every state.

The error correction processing unit 13 has an error correction code group including a plurality of error correction codes which are different from each other and are ordered based on correction capability which is defined based on a predetermined reference. An error correction code includes a program for processing for encoding from information data to a code word and decoding from a code word to information data, a setting value required for an operation of the program, and the like. Each of the error correction codes is managed with a parameter representing correction capability of the corresponding error correction code. Thus, it is possible to switch to an error correction code having more proper correction capability corresponding to the state of the monitoring object 20 by referring to the parameter when the error correction code is switched. A parameter representing correction capability of an error correction code may be quantified by using the number of random error correctable bits, the number of burst error correctable bits, and a coding rate, for example, as a reference. Further, an error correction code may be a BCH code or a Reed-Solomon code and other error correction codes may be used.

Here, as error correction codes included in the error correction code group, error correction codes which are preliminarily programmed in the device may be used. Alternatively, a means for setting an error correction code from the outside may be incorporated in the control device so that an error correction code can be updated through a network, for example. Due to such configuration, change of an installation position of the monitoring object 20 and the like can be better handled by setting change.

When the error correction processing unit 13 acquires a correction rate of every state from the correction rate calculation unit 12, the error correction processing unit 13 refers to a parameter of the error correction code based on a value of the acquired correction rate of every state so as to perform processing of switching an error correction code to a more proper error correction code.

Figure 6:
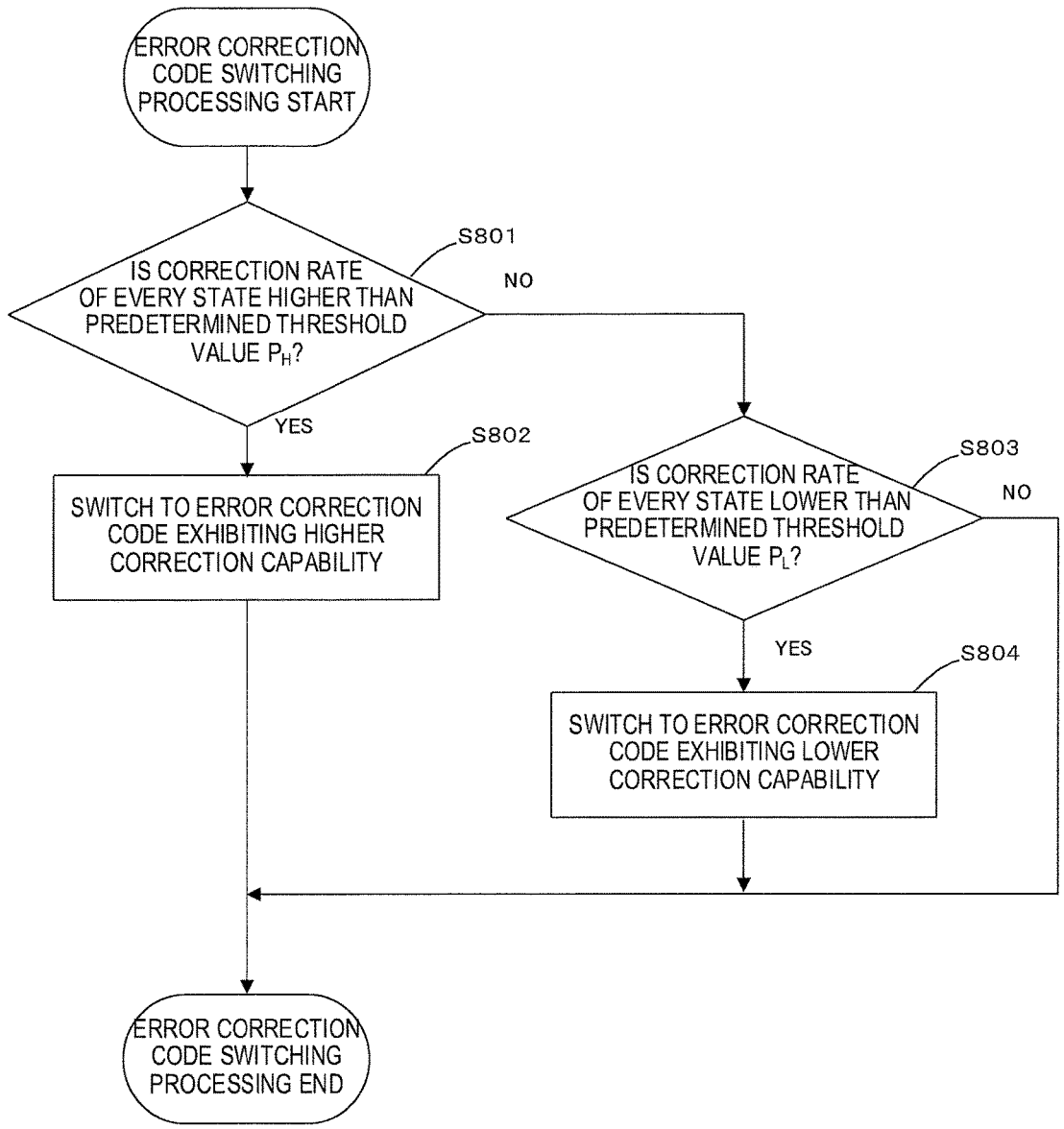
FIG. 6 is a flowchart illustrating an example of an operation of error correction code switching processing according to the present invention.

An example of error correction code switching processing according to the present embodiment is described based on a flowchart of FIG. 6. The error correction processing unit 13 compares a correction rate of every state acquired from the correction rate calculation unit 12 with a predetermined threshold value PH which is set (S801). In a case where the correction rate of every state is higher than the predetermined threshold value PH, the error correction processing unit 13 refers to a parameter of the error correction code so as to switch the code to an error correction code exhibiting higher correction capability (S802). In a case where the correction rate of every state is not higher than the predetermined threshold value PH, the error correction processing unit 13 further compares the correction rate of every state with a predetermined threshold value PL which is set (S803). In a case where the correction rate of every state is lower than the predetermined threshold value PL, the error correction processing unit 13 refers to the parameter of the error correction code so as to switch the code to an error correction code exhibiting lower correction capability (S804).

Increase of the correction rate of every state represents that a value of the number Csi of code words which are decoded until correction is decreased (raise of error frequency) or a value of the corrected bit number Esi of code words for correction is increased (increase in the number of error bits). When such state is generated, it is conceivable that an operation environment of the monitoring object 20 becomes severer. Therefore, an error correction code is switched to an error correction code exhibiting higher correction capability in advance so as to be able to prevent an occurrence of an uncorrectable error causing system stop and the like. Further, lowering of the correction rate of every state represents that an error rate of a code word is lowered inversely with the above description. Therefore, an error correction code is switched to an error correction code exhibiting lower correction capability so as to be able to suppress excessive resource use for error correction.

Here, a threshold value, which is used in switching an error correction code, of the correction rate of every state may be set to be arbitrarily switched from the outside. By providing such means, a trigger of switching of error correction codes can be adjusted in accordance with a state after installation in an operation environment.

Further, as for the order of correction capability in the error correction code group, a means enabling arbitrary rewriting from the outside may be provided. Provision of such means enables such adjustment that a more proper error correction code is selected in accordance with a state after installation in an operation environment.

Furthermore, in order to correspond to switching of an error correction code, the error correction processing unit 13 may be provided with a function for further encoding a code word which is encoded by an error correction code before switching into an error correction code after switching.

Figure 7:
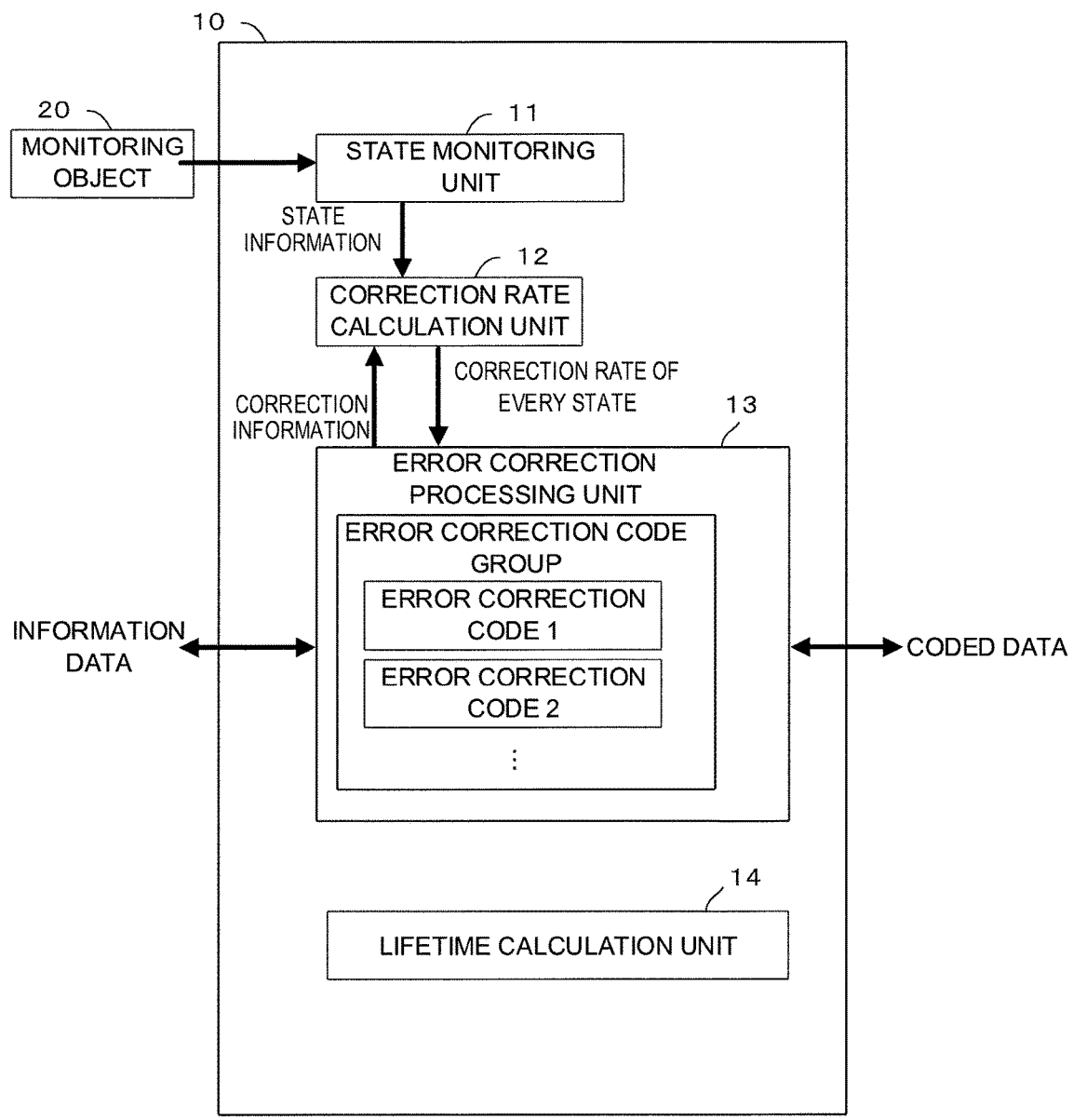
FIG. 7 is a functional block diagram illustrating the control device having a lifetime calculation function according to the present invention.

Here, failures causing stationary errors are increased along with secular change in a device and a correction rate is increased along with the increase of the failures, so that a difference between the correction rate and the predetermined threshold value is set as a device remaining life. FIG. 7 is a functional block diagram illustrating the control device having a lifetime calculation function according to the present invention. Further, FIG. 8 is a functional block diagram illustrating the control device having a failure diagnosis function using the device remaining lifetime according to the present invention.

Here, as illustrated in FIG. 7, a function for calculating a device remaining lifetime (a lifetime calculation unit 14) is introduced to the control device 10 having the error correction function by which error correction capability is controlled based on a correction rate which is calculated for every state, which is determined in the state monitoring unit 11, of a machine. As a method for controlling an error correction code, a means which switches an error correction code to an error correction code exhibiting high correction capability when the correction rate exceeds a predetermined threshold value and switches an error correction code to an error correction code exhibiting low correction capability when the correction rate is lower than the predetermined threshold value may be provided in one embodiment.

At this time, a device remaining lifetime L is defined as a constant value for an applied error correction code by adding a correction capability rank R of the applied error correction code. In one embodiment, the device remaining lifetime L may be defined as Formula 2 by using the correction capability rank R, a correction rate P, and an upper-limit threshold value Ph. The correction capability rank R representing correction capability of an error correction code may be the number of random error correctable bits, the number of burst error correctable bits, or a coding rate.

$$\text{Device remaining lifetime } L = R*(Ph-P) \quad \text{(Formula 2)}$$

Further, the state monitoring unit 11 analyzes a state of the machine from the monitoring object 20 so as to output state information. The correction rate calculation unit 12 calculates a correction rate based on the correction information received from the error correction processing unit 13 for every piece of state information. In the present embodiment, the above-described correction rate is calculated for every state which can be state information. That is, when state information which can represent n pieces of states is in a state s (s∈S, S={s1, ..., sn}) and an error correction code whose number of error correctable bits is Ts bits is used, the correction rate Ps is defined as Formula 3 below by using the number Csi (si=1, ..., Js) of code words which have been decoded by respective correction and the corrected bit number Esi (si=1, ..., Js) of code words for correction at time when Js-th time, which is the predetermined number of times, correction is performed.

$$\text{Correction rate } Ps = (\Sigma(Esi/(Csi \times Ts)))/Js \quad \text{(Formula 3)}$$

Here, a failure factor coefficient $\alpha s$ is introduced as a variable of every piece of state information so as to derive a device remaining lifetime Ls of every state from the correction rate which is calculated for every piece of state information of the machine. In one embodiment, the device remaining lifetime Ls may be expressed as Formula 4.

$$\text{Device remaining lifetime } Ls \text{ of every state} = Rs*(Ph-Ps)/\alpha s \quad \text{(Formula 4)}$$

The failure factor coefficient $\alpha s$ can be rewritten by a failure factor coefficient rewriting means. For example, when it is found that there is a causal relationship between a particular form of a failure of the device and a high temperature operation, a failure factor coefficient at which the state of the machine is in high temperature is increased so as to be able to reduce a device remaining lifetime in the high temperature and bring generation of a maintenance preparation request forward.

Then, a maintenance preparation request and a maintenance execution request are outputted based on this lifetime prediction. For example, among device remaining lives of respective states, the shortest lifetime is set as the definitive lifetime and a request is outputted in accordance with the threshold value Th. A maintenance preparation request is outputted by a maintenance preparation information output means. Further, a maintenance execution request is outputted by a maintenance execution information output means. Both of the output means include a means for rewriting a threshold value by which whether or not request information is outputted is determined.

Further, this failure factor coefficient may be obtained from a statistic which is obtained by monitoring a plurality of similar machines (a means performing statistic calculation).

It is conceivable to employ a machine tool as the monitoring object 20 as described above, for example, as an object to which the control device having such error correction capability is applied, and to use temperature information as state information so as to be applied to error correction of data on a memory which is used in the machine tool or the control device. In this case, it is possible to switch error correction codes so as to cope with deterioration of an operation environment caused by temperature increase.

Further, it is conceivable to employ a processor which executes a control program as the monitoring object 20 described above, for example, as another application object, and to use a name of a program block which is in execution by the control device of the machine as state information so as to be able to be applied to error correction of the control program which is written in a ROM with error correction function. In this case, configuration can be made such that error correction codes are switched to perform encode again in accordance with a correction rate of every program block while the control program is repeatedly executed. Further, the control device according to the embodiment of the present invention may be used for data which is dealt in communication other than error correction in a memory or the like.

Thus, the embodiment of the present invention has been described in the form of the control device having the error correction capability, but the above-described process including a series of processing can be provided in a form of a program or a recording medium which is readable by a computer in which the program is stored. In this case, the above-described processing may be performed by reading and executing the program by the computer. Here, the recording medium which is readable by a computer represents a magnetic disk, a magneto-optical disk, a CD-ROM, a DVD-ROM, a semiconductor memory, and the like. Further, this computer program may be delivered to a computer through a communication line and the computer receiving this delivery may execute the program.

As described above, according to the present invention, a device remaining lifetime is dynamically calculated for every state of a machine so as to be able to perform an efficient maintenance operation corresponding to the state of the machine.

The embodiment of the present invention is described above. However, the present invention is not limited to the example of the above-described embodiment, but the present invention can be embodied in other aspects by adding arbitrary alterations.

The invention claimed is:

1. A control device which performs encoding from information data to a code word and decoding from the code word to the information data by an error correction code and has an error correction function by which a correctable error is automatically corrected in the decoding, the control device including a processor configured to perform a method comprising:

monitoring a plurality of states of a monitoring object;

outputting the plurality of states of the monitoring object as state information;

calculating a correction rate of each state of the plurality of states based on the outputted state information and error correction information;

switching a plurality of error correction codes based on the correction rate of each state of the plurality of states so as to perform encoding from information data to a code word and decoding from the code word to the information data, the plurality of error correction codes included in an error correction code group and the plurality of error correction codes are ordered based on a correction capability defined by a predetermined reference;

outputting correction information related to error correction based on the switched plurality of error correction codes; and calculating a device lifetime of a device, the device lifetime being a current remaining lifetime of the device based on a correction capability value of a current error correction code, a current correction rate, and a failure factor coefficient of a current operation state of the device.

2. The control device according to claim 1, wherein the process is further configured to perform the method comprising:

rewriting the failure factor coefficient.

3. The control device according to claim 1, wherein the process is further configured to perform the method comprising:

monitoring the device lifetime of the device; and outputting maintenance preparation information based on the monitored device lifetime of the device.

4. The control device according to claim 3, wherein the process is further configured to perform the method comprising:

rewriting a threshold value, wherein the outputted maintenance preparation information is further based on the rewritten threshold value.

5. The control device according to claim 1, wherein the process is further configured to perform the method comprising:

monitoring the device lifetime of the device; and outputting maintenance execution information based on the monitored device lifetime of the device.

6. The control device according to claim 5, wherein the process is further configured to perform the method comprising:

rewriting a threshold value, wherein outputted the maintenance execution information is further based on the rewritten threshold value.

7. The control device according to claim 1, wherein the process is further configured to perform the method comprising:

statistically calculating the failure factor coefficient based on a plurality of states of a plurality of machines.

8. The control device according to claim 2, wherein the process is further configured to perform the method comprising:
monitoring the device lifetime of the device; and
outputting maintenance preparation information based on the monitored device lifetime of the device.

9. The control device according to claim 2, wherein the process is further configured to perform the method comprising:
monitoring the device lifetime of the device; and
outputting maintenance execution information based on the monitored device lifetime of the device.

10. The control device according to claim 2, wherein the process is further configured to perform the method comprising:
statistically calculating the failure factor coefficient based on a plurality of states of a plurality of machines.

11. The control device according to claim 3, wherein the process is further configured to perform the method comprising:
statistically calculating the failure factor coefficient based on a plurality of states of a plurality of machines.

12. The control device according to claim 4, wherein the process is further configured to perform the method comprising:
statistically calculating the failure factor coefficient based on a plurality of states of a plurality of machines.

13. The control device according to claim 5, wherein the process is further configured to perform the method comprising:
statistically calculating the failure factor coefficient based on a plurality of states of a plurality of machines.

14. The control device according to claim 6, wherein the process is further configured to perform the method comprising:
statistically calculating the failure factor coefficient based on a plurality of states of a plurality of machines.

15. The control device according to claim 8, wherein the process is further configured to perform the method comprising:
statistically calculating the failure factor coefficient based on a plurality of states of a plurality of machines.

16. The control device according to claim 9, wherein the process is further configured to perform the method comprising:
statistically calculating the failure factor coefficient based on a plurality of states of a plurality of machines.

* * * * *